US012300480B2

(12) United States Patent
Marth

(10) Patent No.: US 12,300,480 B2
(45) Date of Patent: May 13, 2025

(54) SHAPED-CHANNEL SCANNING NOZZLE FOR SCANNING OF A MATERIAL SURFACE

(71) Applicant: Elemental Scientific, Inc., Omaha, NE (US)

(72) Inventor: Beau A. Marth, La Vista, NE (US)

(73) Assignee: ELEMENTAL SCIENTIFIC, INC., Omaha, NE (US)

( * ) Notice: Subject to any disclaimer, the term of this patent is extended or adjusted under 35 U.S.C. 154(b) by 694 days.

(21) Appl. No.: 17/569,936

(22) Filed: Jan. 6, 2022

(65) Prior Publication Data

US 2022/0230864 A1  Jul. 21, 2022

Related U.S. Application Data

(60) Provisional application No. 63/137,873, filed on Jan. 15, 2021.

(51) Int. Cl.
  *H01J 49/10* (2006.01)
  *H01J 49/04* (2006.01)
  *H01L 21/67* (2006.01)

(52) U.S. Cl.
  CPC ............ *H01J 49/105* (2013.01); *H01J 49/04* (2013.01); *H01L 21/67051* (2013.01); *H01L 21/6708* (2013.01)

(58) Field of Classification Search
  CPC ........... H01L 21/67126; H01L 21/6715; H01L 21/6719; H01L 21/67259; H01L 21/67748;
  (Continued)

(56) References Cited

U.S. PATENT DOCUMENTS 7,448,741 B2    11/2008  Von Essen
2009/0130614 A1*  5/2009  Ookouchi ........... H01L 21/6719
                                                    399/246
(Continued)

FOREIGN PATENT DOCUMENTS

CN    109378289 A  *  2/2019  ....... H01L 21/02057
JP    2009158703 A     7/2009

OTHER PUBLICATIONS

International Search Report and Written Opinion for Application No. PCT/US2022/011425, dated Apr. 26, 2022.

*Primary Examiner* — John Fitzgerald
*Assistant Examiner* — Truong D Phan
(74) *Attorney, Agent, or Firm* — Kevin E. West; Advent, LLP

(57) ABSTRACT

Systems and methods are described for introducing one or more fluid streams from a nozzle having one or more shaped channels to one or more material surfaces and removing the fluid streams for scanning for chemical species of interest. A nozzle embodiment includes, but is not limited to, a nozzle body configured to couple to a positionable nozzle arm support for positioning the nozzle with respect to a material surface, the nozzle body defining at least one fluid port to receive a fluid; and a nozzle hood coupled to the nozzle body, the nozzle hood defining an elongated shaped channel having a first fluid channel and a second fluid channel extending from the at least one fluid port, the first fluid channel and the second fluid channel configured to direct fluid along the material surface within at least a portion of each of the fluid channels.

4 Claims, 9 Drawing Sheets

(58) Field of Classification Search
CPC ... H01L 21/67772; H01L 22/12; H01L 22/14; H01L 22/34; H01L 21/66; H01L 21/67; H01L 21/677; H01L 21/67051; H01L 21/6708; H01J 49/10; H01J 49/04; H01J 49/105; G01N 21/69
USPC ..................................................... 73/53.01
See application file for complete search history.

(56) References Cited

U.S. PATENT DOCUMENTS

| | | |
|---|---|---|
| 2013/0037511 A1 | 2/2013 | Collins et al. |
| 2019/0164788 A1* | 5/2019 | Han .................. B29C 66/12463 |
| 2019/0172730 A1* | 6/2019 | Yost ................... H01L 21/6715 |
| 2019/0172731 A1 | 6/2019 | Yost et al. |

* cited by examiner

SHAPED-CHANNEL SCANNING NOZZLE FOR SCANNING OF A MATERIAL SURFACE

CROSS-REFERENCE TO RELATED APPLICATIONS

The present application claims the benefit of 35 U.S.C. § 119(e) of U.S. Provisional Application Ser. No. 63/137,873, filed Jan. 15, 2021, and titled "SHAPED-CHANNEL SCANNING NOZZLE FOR SCANNING OF A SEMI-CONDUCTING WAFER." U.S. Provisional Application Ser. No. 63/137,873 is herein incorporated by reference in its entirety.

BACKGROUND

Inductively Coupled Plasma (ICP) spectrometry is an analysis technique commonly used for the determination of trace element concentrations and isotope ratios in liquid samples. ICP spectrometry employs electromagnetically generated partially ionized argon plasma which reaches a temperature of approximately 7,000K. When a sample is introduced to the plasma, the high temperature causes sample atoms to become ionized or emit light. Since each chemical element produces a characteristic mass or emission spectrum, measuring the spectra of the emitted mass or light allows the determination of the elemental composition of the original sample.

Sample introduction systems may be employed to introduce the liquid samples into the ICP spectrometry instrumentation (e.g., an Inductively Coupled Plasma Mass Spectrometer (ICP/ICP-MS), an Inductively Coupled Plasma Atomic Emission Spectrometer (ICP-AES), or the like) for analysis. For example, a sample introduction system may transport an aliquot of sample to a nebulizer that converts the aliquot into a polydisperse aerosol suitable for ionization in plasma by the ICP spectrometry instrumentation. The aerosol generated by the nebulizer is then sorted in a spray chamber to remove the larger aerosol particles. Upon leaving the spray chamber, the aerosol is introduced into the plasma by a plasma torch assembly of the ICP-MS or ICP-AES instruments for analysis.

SUMMARY

Systems and methods are described for introducing one or more fluid streams from a nozzle having one or more shaped channels to one or more material surfaces and removing the fluid streams for scanning for chemical species of interest. In an aspect, a nozzle embodiment includes, but is not limited to, a nozzle body configured to couple to a positionable nozzle arm support for positioning the nozzle with respect to a material surface, the nozzle body defining at least one fluid port to receive a fluid into the nozzle; and a nozzle hood coupled to the nozzle body, the nozzle hood defining an elongated shaped channel having at least a first fluid channel and a second fluid channel extending from the at least one fluid port, the first fluid channel and the second fluid channel configured to direct fluid along the material surface within at least a portion of each of the first fluid channel and the second fluid channel.

In an aspect, a nozzle embodiment includes, but is not limited to, a nozzle body configured to couple to a positionable nozzle arm support for positioning the nozzle body with respect to a material surface, the nozzle body defining a fluid port configured to receive a fluid into the nozzle and defining an interior region having a vacuum port configured to couple with a vacuum source; and a nozzle hood coupled to the nozzle body, the nozzle hood including an exterior wall and an interior wall defining at a first fluid channel and a second fluid channel between the exterior wall and the interior wall and in fluid communication with the fluid port, the interior wall bounding at least a portion of the interior region, wherein an outlet of the fluid port is positioned between the exterior wall and the interior wall to introduce fluid from the fluid port into at least a portion of each of the first fluid channel and the second fluid channel to direct the fluid along the material surface within the portion of each of the first fluid channel and the second fluid channel during application of a vacuum to the vacuum port by the vacuum source.

In an aspect, a method embodiment includes, but is not limited to, introducing a scan fluid to the surface of the material via a nozzle, the nozzle including a nozzle body configured to couple to a positionable nozzle arm support for positioning the nozzle with respect to a material surface, the nozzle body defining a fluid port configured to receive a fluid into the nozzle and defining an interior region having a vacuum port configured to couple with a vacuum source, and a nozzle hood coupled to the nozzle body, the nozzle hood including an exterior wall and an interior wall defining at a first fluid channel and a second fluid channel between the exterior wall and the interior wall and in fluid communication with the fluid port, the interior wall bounding at least a portion of the interior region, wherein an outlet of the fluid port is positioned between the exterior wall and the interior wall to introduce fluid from the fluid port into at least a portion of each of the first fluid channel and the second fluid channel to direct the fluid along the material surface within the portion of each of the first fluid channel and the second fluid channel during application of a vacuum to the vacuum port by the vacuum source; directing the scan fluid along the surface of the material, via the nozzle, at least a portion of the fluid held within each of the first fluid channel and the second fluid channel; joining the scan fluid from the first fluid channel and the second fluid channel together at a region of the nozzle hood distinct from the fluid port; and removing the scan fluid from the surface of the material through the nozzle.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Overview

Figure 1:
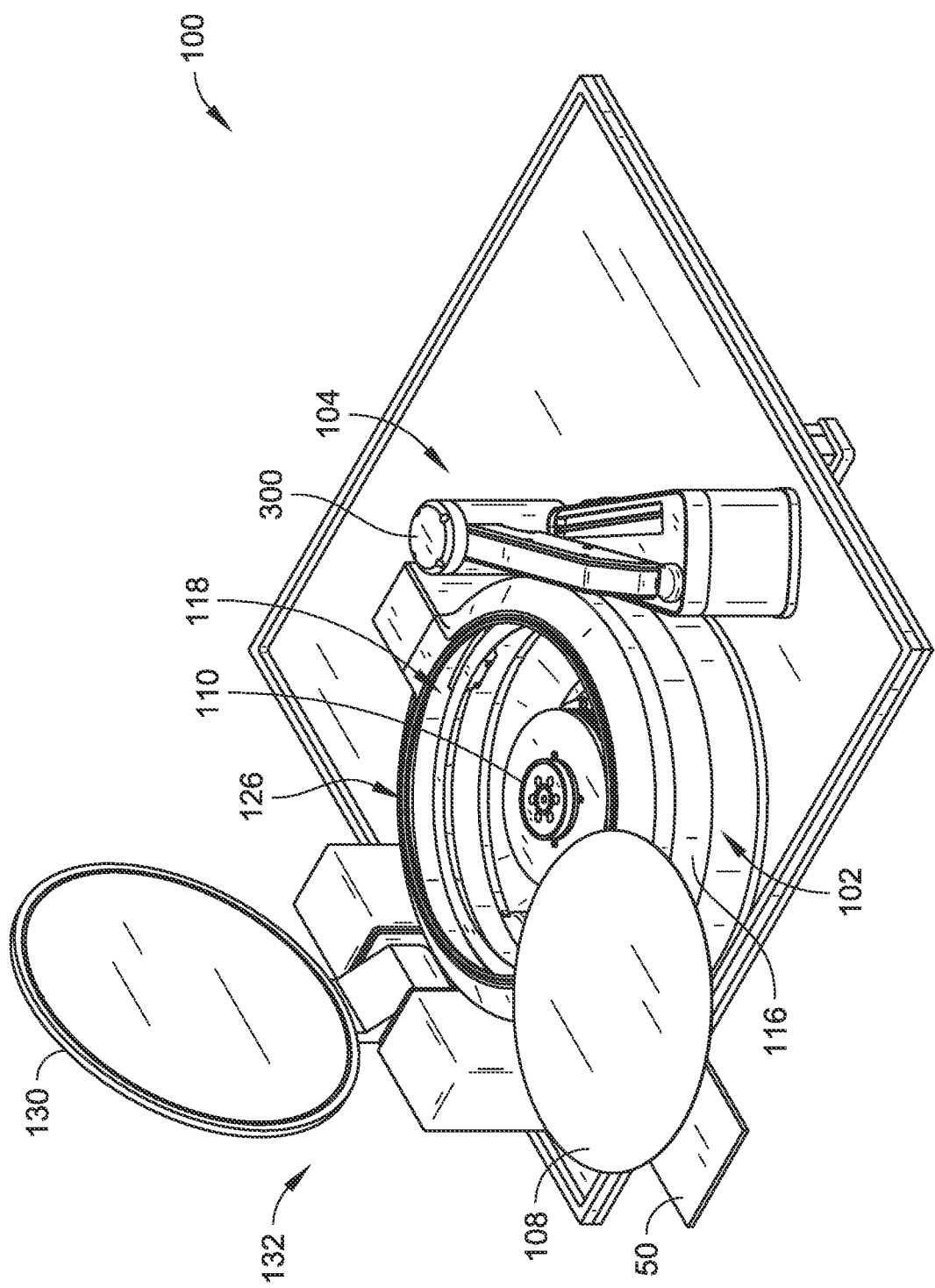
FIG. 1 is an isometric view of a system for integrated decomposition and scanning of a semiconducting wafer, in accordance with embodiments of this disclosure.
Figure 2:
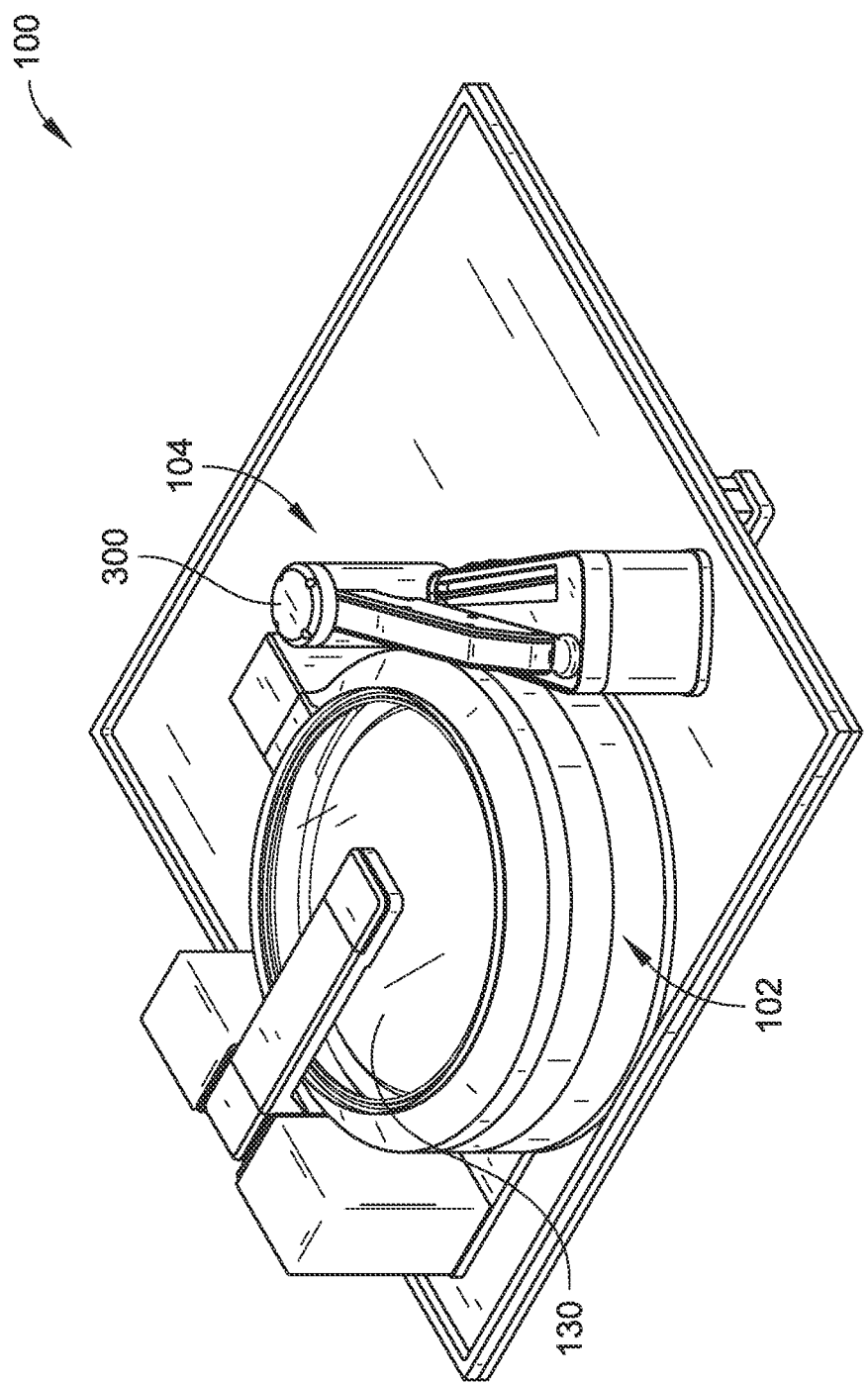
FIG. 2 is an isometric view of the system of FIG. 1 with a semiconducting wafer positioned within a chamber.
Figure 3:
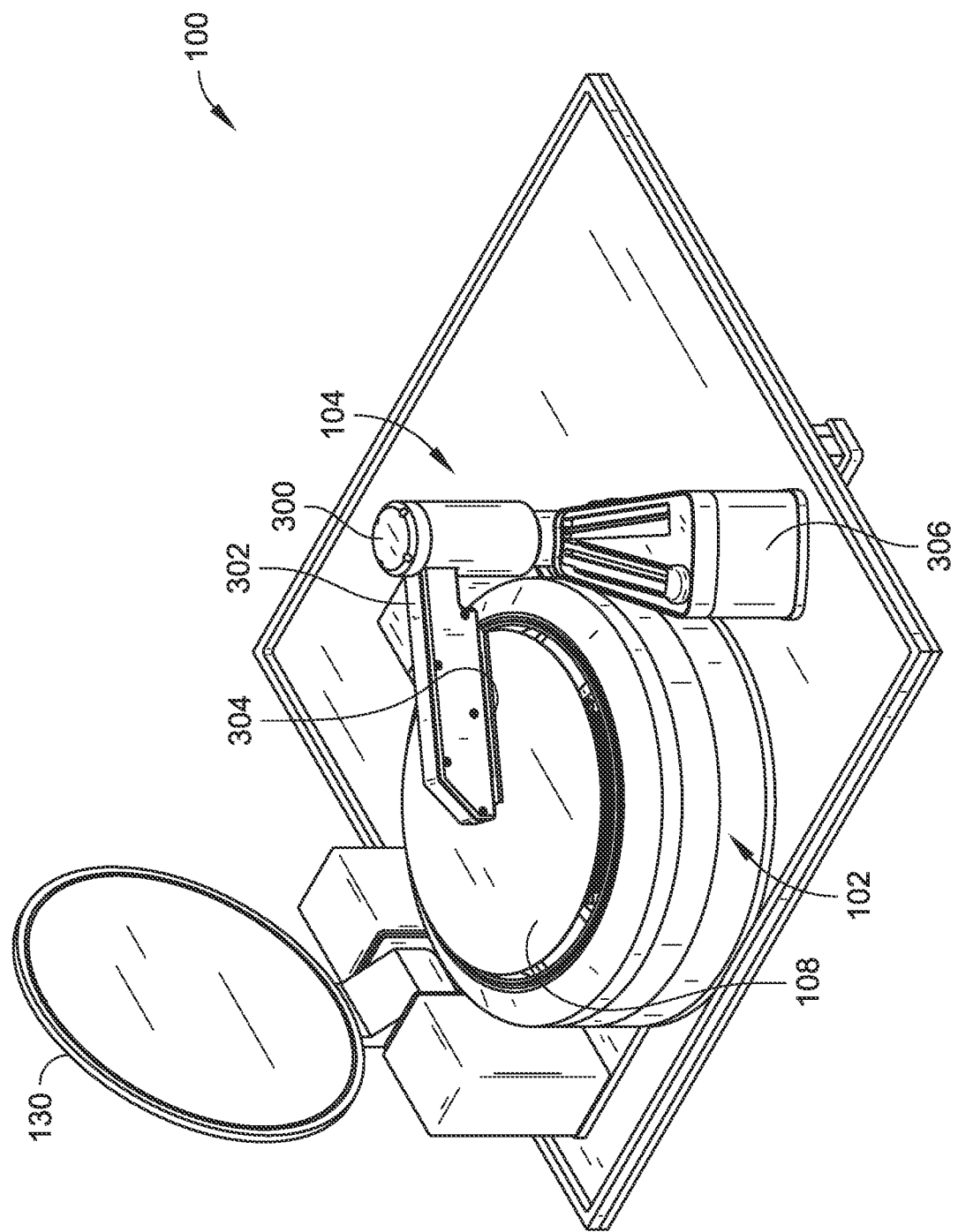
FIG. 3 is an isometric view of the system of FIG. 1, with a scan arm positioning a nozzle over a surface of the semiconducting wafer.
Figure 4:
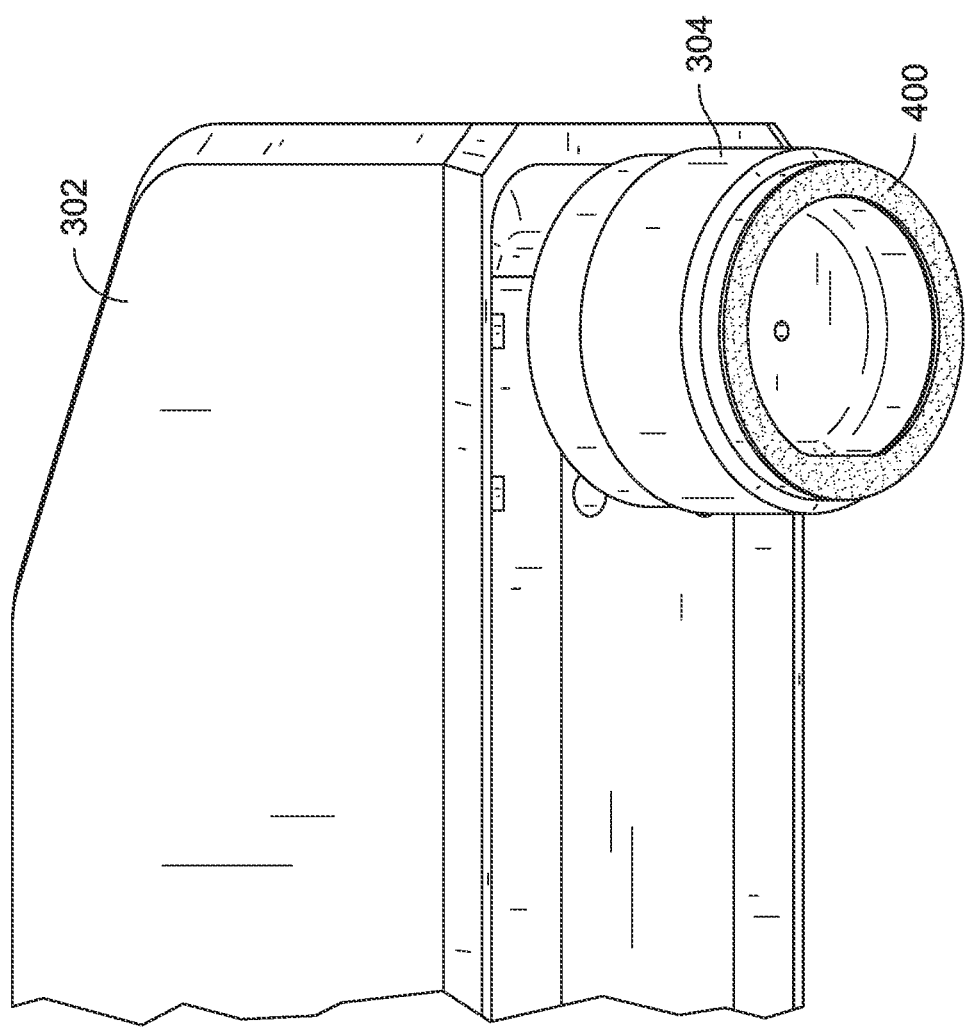
FIG. 4 is an isometric view of an underside of the scan arm of the system of FIG. 1, shown with scanning fluid dispensed from a nozzle.
Figure 5:
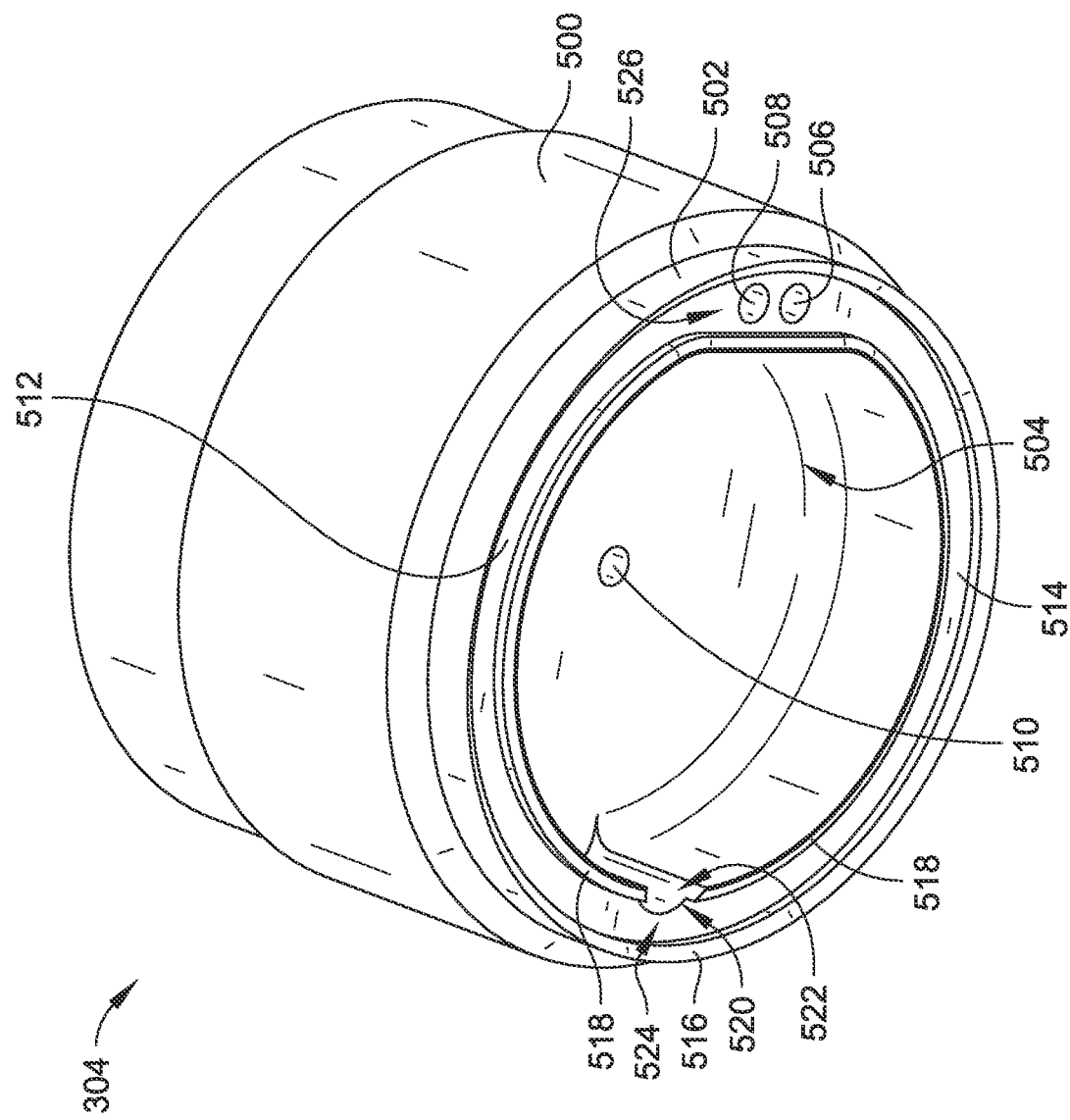
FIG. 5 is an isometric view of an underside of the nozzle of FIG. 4, shown without scanning fluid.

Determination of trace elemental concentrations or amounts in a sample can provide an indication of purity of the sample, or an acceptability of the sample for use as a reagent, reactive component, or the like. For instance, in certain production or manufacturing processes (e.g., mining, metallurgy, semiconductor fabrication, pharmaceutical processing, etc.), the tolerances for impurities can be very strict, for example, on the order of fractions of parts per billion. For semiconductor wafer processing, the wafer is tested for impurities, such as metallic impurities, that can degrade the capabilities of the wafer or render the wafer inoperable due to diminished carrier lifetimes, dielectric breakdown of wafer components, and the like.

Vapor phase decomposition (VPD) and subsequent scanning of the wafer is a technique to analyze the composition of the wafer to determine whether metallic impurities are present. Traditional VPD and scanning techniques have limited throughput for facilitating the treatment and scanning of silicon wafers for impurity analysis. For instance, systems often utilize separate chambers for the VPD procedure and for the scanning procedure. In the VPD chamber, silicon dioxide and other metallic impurities present at the surface are contacted with a vapor (e.g., hydrofluoric acid (HF), hydrogen peroxide ($H_2O_2$), combinations thereof) and removed from the surface as vapor (e.g., as silicon tetrafluoride ($SiF_4$)). The treated wafer is transported to a separate chamber for scanning, where a liquid droplet is introduced to the treated wafer surface to collect residue following reaction of the decomposition vapor with the wafer. The scanning procedure can involve holding a droplet on the surface of the wafer with a scan head and rotating the wafer, while moving the scan head or keeping the scan head stationary to move the droplet over the surface. After multiple revolutions of the wafer, the droplet interacts with the desired surface area of the wafer to draw any residue from the contacted surface following decomposition. However, traditional wafer treatment techniques require significant amounts of time and equipment to process a wafer, such through movement of the wafer from a decomposition chamber to a scan chamber to a rinse chamber during treatment, utilizing scan nozzles that have limited droplet interaction with the wafer surface during scanning (i.e., requiring multiple revolutions of the wafer to interact the droplet with the entire surface area or a portion thereof), and the like. Moreover, such handling of the wafer can potentially expose technicians or other individuals to toxic hydrofluoric acid or can increase the risk of environmental contamination to the wafer during transfer of the wafer between the various process chambers, which also require a substantial physical process floor footprint to facilitate the equipment and transfer mechanisms between the equipment.

Accordingly, the present disclosure is directed, at least in part, to systems and methods for semiconductor wafer decomposition and scanning, where a chamber facilitates decomposition and scanning of the semiconducting wafer with a single chamber footprint, and where a nozzle directs one or more streams of fluid along one or more surfaces of the semiconducting wafer guided by a nozzle hood defining one or more elongated channels to direct the stream along the wafer surface. The elongated channels can be straight, curved, or combinations thereof, to provide geometric configurations of the scan fluid during filling of the nozzle, which in turn directs the scanning fluid across the surface of the wafer. The nozzle can include one or more vacuum ports to facilitate a vacuum applied to the nozzle to maintain scanning fluid within the elongated channels, within an interior region of the nozzle, or combinations thereof. In implementations, the nozzle includes a thinned region defined by at least one of the elongated channels in a region of the nozzle opposite a location of the filling port(s) through which the scanning fluid is introduced to the surface of the wafer, where the thinned region can facilitate controlled recovery of the fluid stream during recovery through a recovery port. In implementations, the recovery port is adjacent the filling port. In implementations, filling and recovery of the fluid stream is facilitated through a single port.

The chamber can provide zones within the chamber for decomposition and rinsing while controlling fluid movement within the chamber, such as for draining and preventing cross contamination. A motor system can control a vertical position of the wafer support with respect to the chamber body to move the semiconductor within the chamber body, with positioning above the chamber body supported by the motor system to load and unload wafers, provide access to the nozzle, and the like. The chamber can further incorporate a nebulizer to direct decomposition fluid that is aerosolized by the nebulizer directly onto the surface of the semiconducting wafer while the wafer support positions the semiconducting wafer within an interior region of the chamber. A chamber can incorporate a lid that can open and close with respect to the chamber to isolate the interior region of the chamber from the region exterior to the chamber, such as during the decomposition process. The nozzle can be positioned with respect to the chamber by a rotatable scan arm, where the nozzle can be positioned away from the chamber to facilitate lid closure (e.g., during the decomposition procedure) or to facilitate rinsing of the nozzle at a rinse station. Further, the scan arm can position the nozzle over the semiconducting wafer during the scanning procedure, such as through rotation of the nozzle with respect to the wafer surface. The system can utilize a fluid handling system including switchable selector valves and pumps to control introduction of fluid to the nozzle, from the surface of the wafer, for preparation of blanks, for rinsing system components, and the like. Following or during the scanning procedure, the scanning fluid can be collected and sent to an analysis device (e.g., ICPMS device) for analytical determination of the composition of the scanning fluid.

Example Implementations

FIGS. 1 through 9 illustrate aspects of a system for integrated decomposition and scanning of a semiconducting wafer ("system 100") in accordance with various embodiments of this disclosure. While the system 100 is described with reference to a semiconducting wafer, the system 100 is not limited to such materials and can be utilized with any material, such as a material having a substantially planar surface. The system 100 generally includes a chamber 102 and a scan arm assembly 104 supported a fluid handling system and a motor system to facilitate at least decomposition and scanning procedures of a semiconducting wafer 108 (sometimes referred to herein as the "wafer") through introduction of decomposition fluids to the wafer 108 and through introduction to and removal of scanning fluids from one or more surfaces of the wafer 108. The chamber 102 provides an environment for each of wafer decomposition and wafer scanning with a single chamber footprint, and includes a wafer support 110 to hold the wafer 108 and a motor system to control a vertical position of the wafer support 110 with respect to the chamber 102 (e.g., within the chamber 102, above the chamber 102, etc.) to position the wafer 108 for the decomposition and scanning procedures or during other procedures of the system 100. The motor system additionally provides rotational control of the wafer support 110 to rotate the wafer 108 during various procedures of the system 100, and provides rotational and vertical control of the scan arm assembly 104 to bring a nozzle of the scan arm assembly 104 into positions over the wafer 108 during scanning procedures (e.g., shown in FIG. 3) and into positions of a rinse station 114 for nozzle cleaning (e.g., shown in FIG. 9). In implementations, the wafer support 110 includes a vacuum table to hold the wafer 108 fixed relative to the wafer support 110, such as during movement of the wafer support 110.

The chamber 102 includes a chamber body 116 defining an interior region 118 to receive the wafer 108 for processing. During an example operation shown in FIG. 1, the system 100 can receive a semiconducting wafer 108 onto the wafer support 110, such as through operation of an automated arm 50 selecting a wafer 108 from a front end unified pod (FOUP) or other location and introducing the selected wafer 108 onto the wafer support 110 (e.g., centered on the wafer support 110). The motor system can position the wafer support 110 at, above, or adjacent to the top portion 122 of the chamber body 122 to permit access to the wafer support 110 by the automated arm 50 to set the wafer 108 onto the wafer support 110. For instance, the wafer support 110 can be positioned adjacent to an opening 126 at the top of the chamber 102 during loading of the wafer 108.

The system 100 can include a lid 130 to isolate the interior region 118 from an exterior region 132 to facilitate wafer decomposition while limiting exposure of the decomposition fluid to the exterior region 132. For example, the lid 130 can have a size and a shape to cover the opening 126 when positioned over the opening 126. The lid 130 can be positionable between an open position (e.g., shown in FIG. 1) and a closed position (e.g., shown in FIG. 2). The open position can be utilized during wafer loading to provide access to the automated arm, during scanning procedures, during wafer unloading procedures, and the like. In implementations, the lid 130 is in the open position when the wafer support 110 is in the first position adjacent to the opening 126 to provide access to the wafer 108 by the nozzle of the scan arm assembly 104. The closed position can be utilized during wafer decomposition procedures to prevent the decomposition fluid from leaving the chamber 102 through the opening 126. In implementations, at least a portion of the lid 130 contacts the chamber body 116 to isolate the interior region 118 from the exterior region 132. The wafer 108 is moved within the interior region 118 through control of the vertical position of the wafer support 110 by the motor system to a second position.

Following introduction of the wafer 108 to the wafer support 110, the system 100 can transition to a decomposition configuration to facilitate decomposition of one or more surfaces or edges of the wafer 108. In implementations, the chamber 102 includes a nebulizer positioned in the chamber body 116 to spray a decomposition fluid onto the surface of the wafer 108 when the wafer support 110. The decomposition fluid can be sprayed directly into the chamber 102 by the nebulizer.

Following decomposition of the wafer 108, the system 100 can transition to a scanning configuration to permit access to one or more surfaces of the wafer 108 by the scan arm assembly 104 without transferring the wafer 108 to a separate scanning system. To transition to the scanning configuration, the motor system can position the wafer support 110 adjacent the opening 126 or otherwise closer to a top of the chamber body 116 to permit access to the surface of the wafer 108 by the scan arm assembly 104. The scan arm assembly 104 generally includes a rotatable arm support 300 coupled to a nozzle housing 302 that supports a nozzle 304 configured to introduce the scan fluid to the surface of the wafer 108 and recover the scan fluid from the surface of the wafer 108. The motor system can control rotation of the rotatable arm support 300, vertical positioning of the rotatable arm support 300, or combinations thereof, to position the nozzle housing 302 and the nozzle 304 across multiple positions within the system 100. For example, the motor system can move the nozzle housing 302 and the nozzle 304 between one or more positions at a rinse station 306 (e.g., shown in FIG. 9) to one or more positions adjacent or above the wafer 108 (e.g., shown in FIG. 3). Example implementations of the nozzle 304 are described further herein with reference to FIGS. 4 through 8F. In implementations, the rotatable arm support 300 rotates or otherwise moves the nozzle 304 to position the nozzle 304 adjacent the wafer 108 when the wafer support 110 is positioned at the top portion of the chamber 102 and to position the nozzle 304 outside a path of the lid 130 from the open position to the closed position when the wafer support 110 is positioned within an interior of the chamber 102 (e.g., during decomposition).

With the nozzle 304 in position adjacent or above the wafer 108 (e.g., shown in FIG. 3), the fluid handling system can control introduction of scanning fluids to and from the nozzle 304 to facilitate scanning procedures of the surface of the wafer 108. Referring to FIGS. 4 through 7, an example implementation of the nozzle 304 is shown. The nozzle 304 is configured to deliver one or more streams of fluid (shown as 400 in FIG. 4) across the surface of the wafer 108, which can cover a greater surface area of the wafer 108 in a shorter period of time than moving a spot-size droplet over the wafer 108. The stream (or streams) of fluid is guided over the surface of the wafer 108 by the nozzle 304 to controllably scan the desired surface area of the wafer 108. In implementations, the nozzle 304 guides the stream of fluid over substantially the entire surface of the wafer 108 in a single revolution of the wafer 108. In implementations, a wedge of the surface (e.g., a sector of the wafer 108 or portion thereof) can be scanned in a fraction of a single revolution of the wafer 108. The scanned area of the wafer 108 generally depends on the shape of the nozzle 304 and the amount of rotation of the wafer 108, where differing nozzle shapes can provide differing scan patterns or coverages of the wafer 108 (e.g., described further with respect to FIGS. 8A through 8F).

The nozzle 304 is shown including a nozzle body 500 defining a nozzle hood 502 and an interior region 504 that direct the flow of fluid received by the nozzle 304 through one or more fluid ports for scanning the wafer. A first fluid port 506, a second fluid port 508, and a vacuum port 510 are shown in an example port configuration. For example, the nozzle 304 receives fluid through action of a pump (e.g., syringe pump, diaphragm pump, etc.) pushing the fluid from a holding line or loop (e.g., a sample holding loop) into the nozzle 304, where it is directed into the first fluid port 506 and through a channel or channels defined by the nozzle hood 502. For example, the nozzle hood 502 is shown forming a first channel 512 and a second channel 514 through which at least a portion of the fluid exiting the first fluid port 506 is directed. In implementations, the first fluid port 506 provides an outlet within the nozzle hood 502 such that fluid exiting the first fluid port 506 is directly introduced from the nozzle body 500 into the nozzle hood 502 to be guided along the surface of the wafer 108 by the nozzle hood 502. The first channel 512 and the second channel 514 can be formed by walls or other structures of the nozzle hood 502 to fluidically couple each of the channels with the port that receives fluid for distribution. For example, the first channel 512 and the second channel 514 are formed between an exterior wall 516 and an interior wall 518 of the nozzle hood 502.

Figure 6:
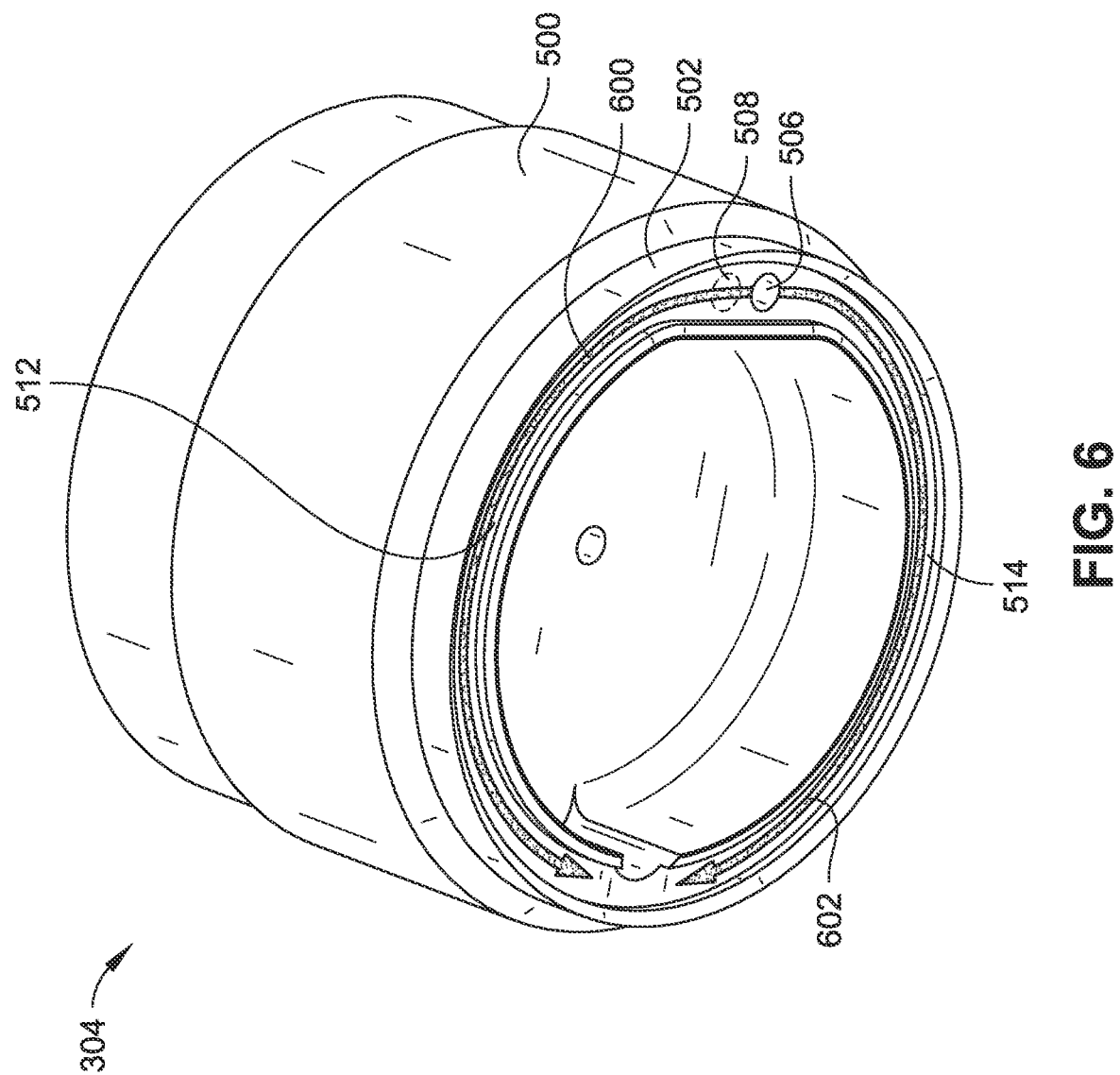
FIG. 6 is an isometric view of an underside of the nozzle of FIG. 4, with directional arrows showing flow of scanning fluid during a filling operation.

In implementations, the fluid is deposited onto the surface of the wafer 108 through the first nozzle port 506 and directed along the surface of the wafer 108 as a substantially continuous fluid stream guided by the nozzle hood 502. For example, FIG. 6 shows that as fluid is deposited onto the surface of the wafer 108, the nozzle hood 502 guides a first portion of fluid 600 into the first channel 512 and guides a second portion of fluid 602 into the second channel 514, where the fluid in the first portion of fluid 600 and the second portion of fluid 602 can remain connected through adhesion or other fluid property. The system 100 can introduce a sufficient volume of fluid to the nozzle 304 such that the first portion of fluid 600 and the second portion of fluid 602 flow through the channels 512 and 514 until the channels are filled, the portions of fluid are joined together, or combinations thereof. For example, the first portion of fluid 600 and the second portion of fluid 602 can flow through the first channel 512 and the second channel 514, respectively, until the front ends of the fluid portions meet at a region 520 of the nozzle forming a single continuous shape of fluid (e.g., shown in FIG. 4). As such, the fluid is permitted to contact the wafer 108 during transit from the first fluid port 506 to the region 520 (e.g., during transit along the channels 512 and 514). In implementations, the region 520 is at a portion of the nozzle hood 502 where the first channel 512 connects with the second channel 514 opposite the first nozzle port 506.

A vacuum can be applied to the interior region 504 of the nozzle body 500 (e.g., via the vacuum port 510) during filling of the nozzle 304 and dispensing of the fluid onto the surface of the wafer 108, during recovery of the fluid from the surface of the wafer 108, and combinations thereof. The vacuum can assist with maintaining tension on the fluid, which can aid in maintaining a continuous fluid stream (e.g., by avoiding gaps in the fluid or breaks in the fluid stream as the fluid traverses the surface of the wafer 108). Alternatively or additionally, the vacuum can divert any excess fluid from the channels 512 and 514 into the interior region 504 of the nozzle body to avoid uncontrolled fluid from exiting the nozzle hood 502 and spilling onto an area of the wafer 108 outside the control of the nozzle 304 (e.g., spilling laterally past the exterior wall 516). As such, during a scanning operation, once the nozzle is in position over the wafer 108, scan fluid can be introduced from the nozzle 304 via a fill port onto the wafer surface 108 within the nozzle hood 502, directed around the channels 512 and 514 to meet at the region 520 opposite the fill port. The wafer 108 can be rotated during the scanning operation and the nozzle housing 302 can rotate the nozzle 304 relative to the wafer 108 via action of the rotatable arm support 300. Excess fluid can flow into the interior region 504 if enough fluid is introduced to fill the nozzle hood 502.

Figure 7:
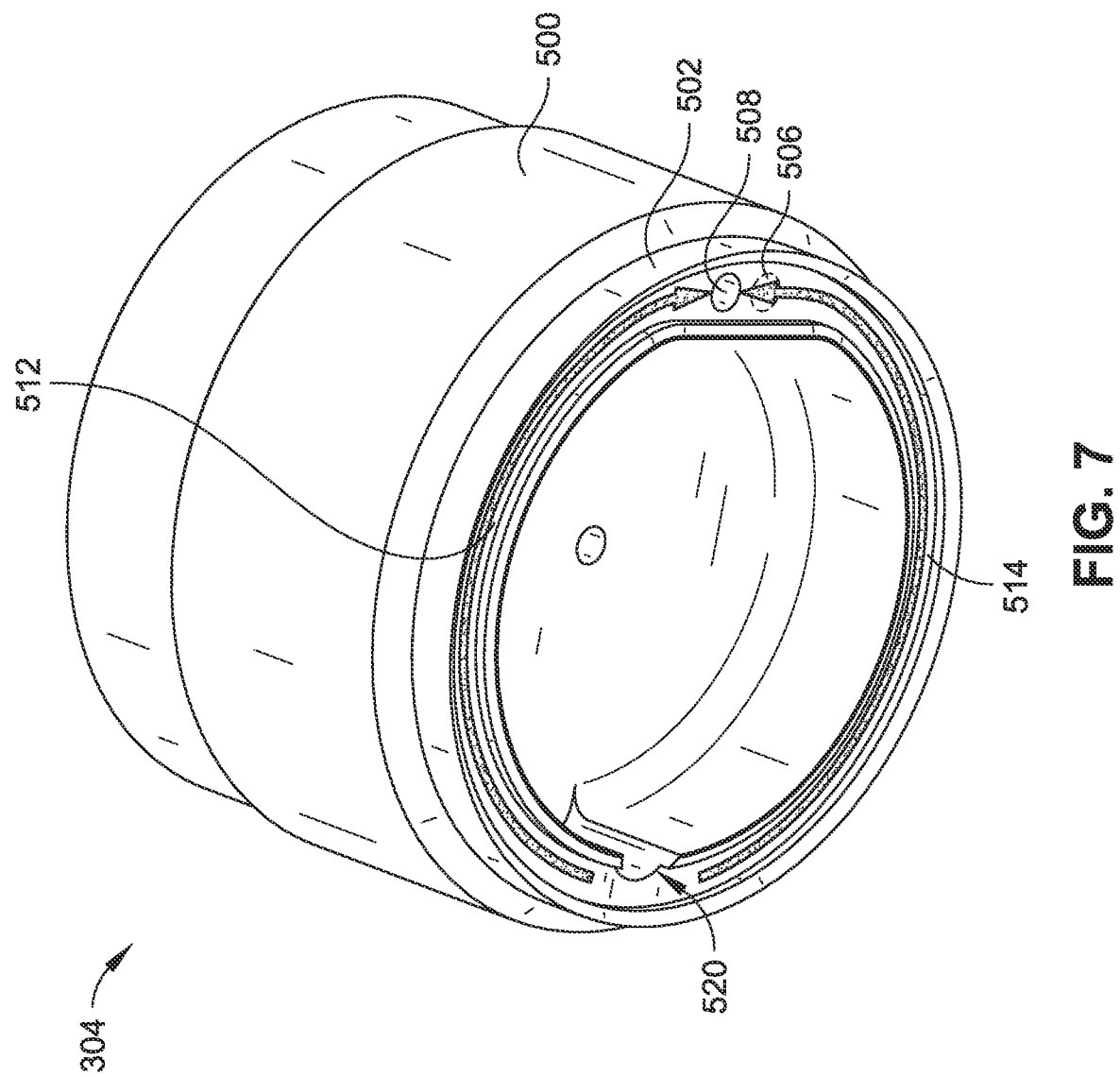
FIG. 7 is an isometric view of an underside of the nozzle of FIG. 4, with directional arrows showing flow of scanning fluid during a recovery operation.

During or following the scanning procedure, fluid introduced to the wafer 108 can be removed from the surface the wafer 108 via the nozzle 304. For example, the fluid can be removed from the surface 146 via action of a pump (e.g., syringe pump, diaphragm pump, etc.) pulling the fluid through a fluid port of the nozzle. In implementations, the fluid is drawn through the second fluid port 508, where the fluid stream breaks into two fluid portions at the region 520 to draw the fluid back through each of the first channel 512 and the second channel 514 to flow back towards the second fluid port 508 (e.g., as shown in FIG. 7). The nozzle can include an opening 522 in the interior wall 518 of the nozzle hood 502, a narrowed portion 524 of the nozzle hood 502 (e.g., narrowed cross section relative to the first channel 512 and the second channel 514), or combinations thereof, to provide an area for the fluid stream to break into the first fluid portion 600 and the second fluid portion 602 during recovery. Excess fluid that may be present in the interior region 504 is drawn back into the nozzle hood 502 to be directed to the recovery port, such as by entering the first channel 512 or the second channel 514 via the opening 522 in the interior wall 518 of the nozzle hood 502.

In implementations, the nozzle 304 includes a region 526 adjacent the fluid recovery port (e.g., the second fluid port 508) having a wider cross section relative to one or more of the first channel 512, the second channel 514, and the region 520 to provide a volume of fluid at the recovery port to assist in fluid uptake (e.g., by avoiding breakage of the fluid stream at the recovery port). While the nozzle 304 is shown in an example implementation have a single vacuum port and two fluid ports, the disclosure is not limited to such configuration, and can include no vacuum ports, more than one vacuum ports, a single fluid port (e.g., fluid introduction and fluid removal is through the same port), more than two fluid ports, or the like.

The first channel 512 and the second channel 514 permit a volume of fluid to travel over the wafer 108, assisted by the nozzle hood 502. In implementations, the nozzle hood 502 has a volume from approximately 50 µL to approximately 5,000 µL. However, the volume of the nozzle hood 502 is not limited to this range and can include volumes less than 50 µL and volumes greater than 5,000 µL. For example, the volume of the channels 512 and 514 can depend on the size of the wafer 108 being processed by the system 100 to provide a desired amount of fluid (e.g., scanning fluid) to the surface of the wafer 108. In implementations, the nozzle hood 502 supports a volume of fluid on the wafer 108 from approximately 100 μL to approximately 500 μL. The dimensions of the nozzle 304 can be selected based on the size of the wafer 108 to be processed by the system 100, where in implementations, the nozzle 304 has a width of approximately the diameter of the wafer 108. In implementations, the length of the nozzle 304 can be from approximately 20 mm to approximately 500 mm. In implementations, the nozzle 304 has a width of approximately the radius of the wafer 108, where rotation of the wafer 108 relative to the nozzle provides coverage of the fluid from the nozzle 304 supported by the nozzle hood 502.

The nozzle 304 can be formed from a single unitary piece, or portions of the nozzle 304 can be formed separately and fused or otherwise coupled together. In implementations, the nozzle 304 is formed from chlorotrifluoroethylene (CTFE), polytetrafluoroethylene (PTFE), or combinations thereof.

Figure 8C:
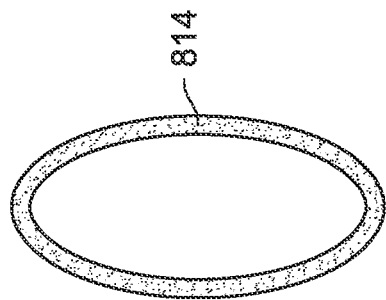
FIG. 8C is bottom plan view of a pattern of scanning fluid flowing through channels of the nozzle on a surface of a wafer in accordance with embodiments of this disclosure.
Figure 8B:
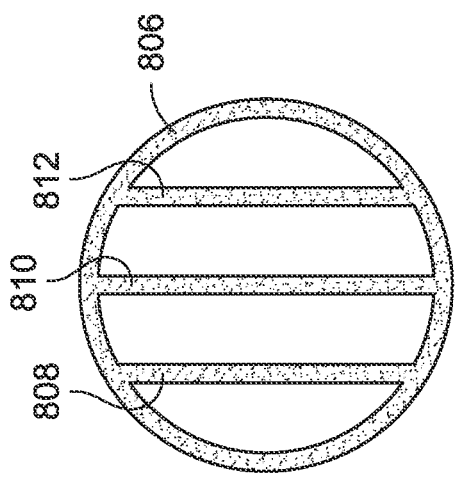
FIG. 8B is bottom plan view of a pattern of scanning fluid flowing through channels of the nozzle on a surface of a wafer in accordance with embodiments of this disclosure.
Figure 8A:
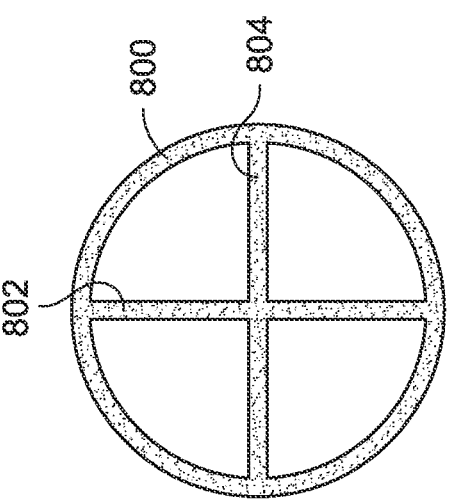
FIG. 8A is bottom plan view of a pattern of scanning fluid flowing through channels of the nozzle on a surface of a wafer in accordance with embodiments of this disclosure.
Figure 8F:
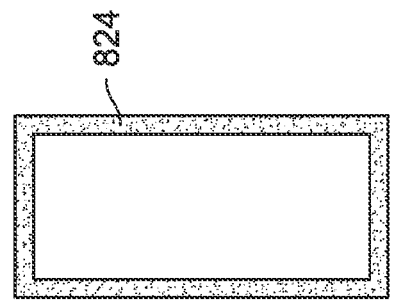
FIG. 8F is bottom plan view of a pattern of scanning fluid flowing through channels of the nozzle on a surface of a wafer in accordance with embodiments of this disclosure.
Figure 8E:
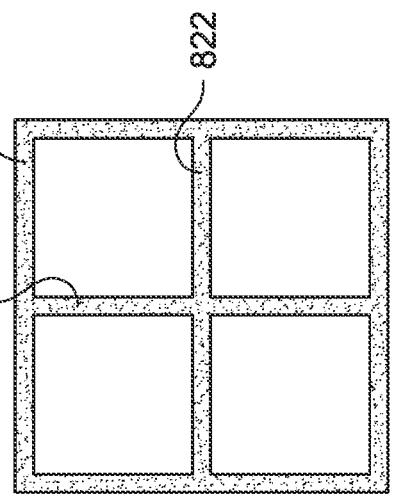
FIG. 8E is bottom plan view of a pattern of scanning fluid flowing through channels of the nozzle on a surface of a wafer in accordance with embodiments of this disclosure.
Figure 8D:
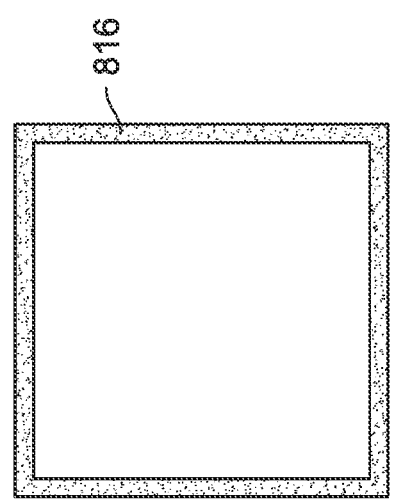
FIG. 8D is bottom plan view of a pattern of scanning fluid flowing through channels of the nozzle on a surface of a wafer in accordance with embodiments of this disclosure.
Figure 9:
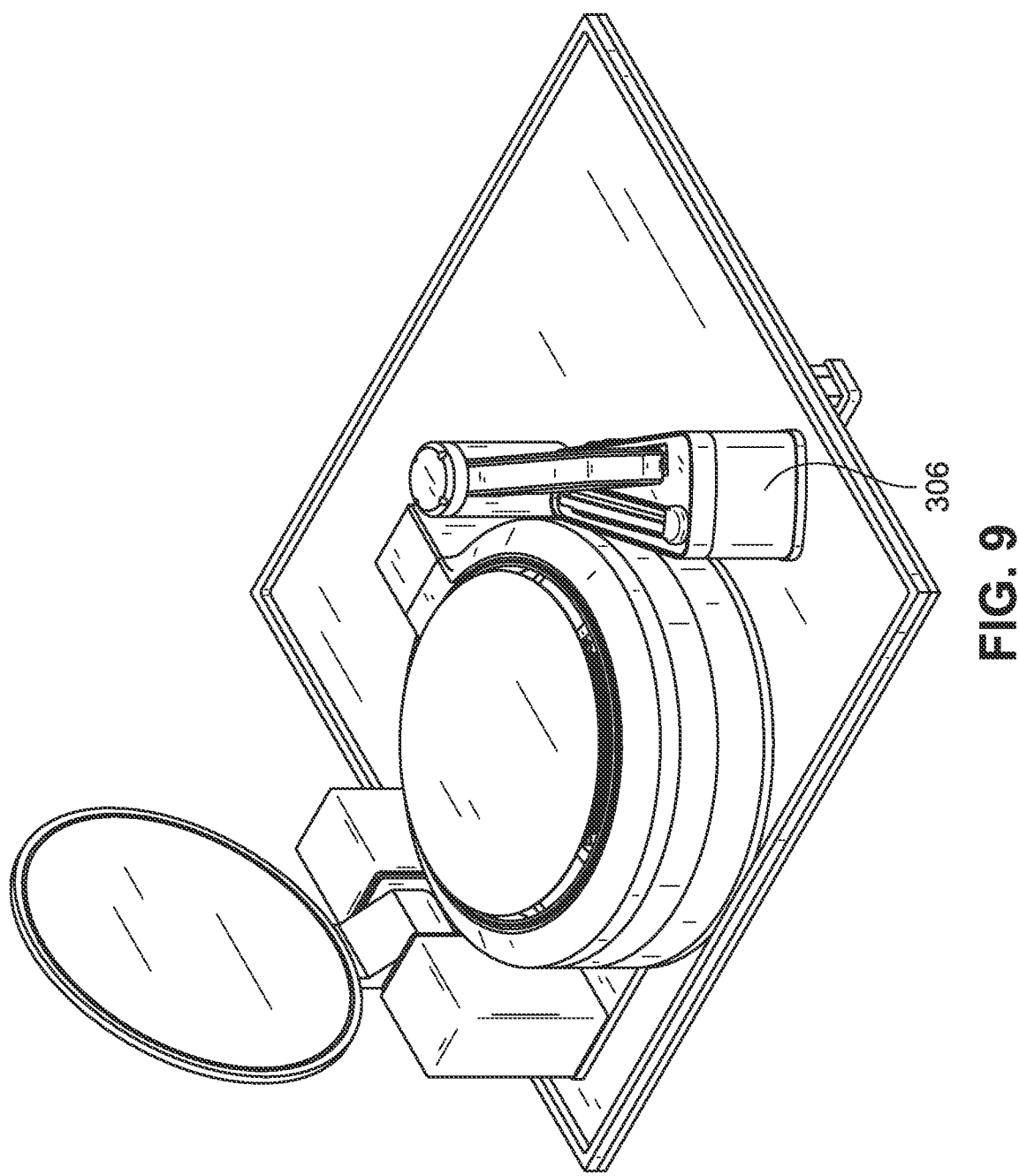
FIG. 9 is a partial isometric view of the system of FIG. 1, with the scan arm positioned at a rinse station for the nozzle.

While the nozzle 304 has been described with a nozzle hood 502 defining a substantially round flow path for fluid streams maintained on the wafer 108 by the nozzle 304, the present disclosure is not limited to a substantially round fluid stream path. For example, the nozzle 304 can include, but is not limited to, round fluid stream paths with one or more linear fluid stream paths, circular fluid stream paths, elliptical fluid stream paths, linear fluid stream paths, irregular fluid stream paths, square fluid stream paths, rectangular fluid stream paths, and combinations thereof. For example, FIG. 8A shows a fluid stream path formed by the nozzle 304 having a round portion 800, a first linear portion 802 intersecting the round portion 800, and a second linear portion 804 intersecting each of the round portion 800 and the first linear portion 802. As another example, FIG. 8B shows a fluid stream path formed by the nozzle 304 having a round portion 806, a first linear portion 808 intersecting the round portion 806, a second linear portion 810 intersecting the round portion 806, and a third linear portion 812 intersecting the round portion 806. As another example, FIG. 8C shows a fluid stream path formed by the nozzle 304 having an elliptical portion 814. As another example, FIG. 8D shows a fluid stream path formed by the nozzle 304 having a square portion 816. As another example, FIG. 8E shows a fluid stream path formed by the nozzle 304 having a square portion 818, a first linear portion 820 intersecting the square portion 818, and a second linear portion 822 intersecting each of the square portion 818 and the first linear portion 820. As another example, FIG. 8F shows a fluid stream path formed by the nozzle 304 having a rectangular portion 824.

Electromechanical devices (e.g., electrical motors, servos, actuators, or the like) may be coupled with or embedded within the components of the system 100 to facilitate automated operation via control logic embedded within or externally driving the system 100. The electromechanical devices can be configured to cause movement of devices and fluids according to various procedures, such as the procedures described herein. The system 100 may include or be controlled by a computing system having a processor or other controller configured to execute computer readable program instructions (i.e., the control logic) from a non-transitory carrier medium (e.g., storage medium such as a flash drive, hard disk drive, solid-state disk drive, SD card, optical disk, or the like). The computing system can be connected to various components of the system 100, either by direct connection, or through one or more network connections (e.g., local area networking (LAN), wireless area networking (WAN or WLAN), one or more hub connections (e.g., USB hubs), and so forth). For example, the computing system can be communicatively coupled to the chamber 102, the motor system, valves described herein, pumps described herein, other components described herein, components directing control thereof, or combinations thereof. The program instructions, when executed by the processor or other controller, can cause the computing system to control the system 100 (e.g., control pumps, selection valves, actuators, spray nozzles, positioning devices, etc.) according to one or more modes of operation, as described herein.

It should be recognized that the various functions, control operations, processing blocks, or steps described throughout the present disclosure may be carried out by any combination of hardware, software, or firmware. In some embodiments, various steps or functions are carried out by one or more of the following: electronic circuitry, logic gates, multiplexers, a programmable logic device, an application-specific integrated circuit (ASIC), a controller/microcontroller, or a computing system. A computing system may include, but is not limited to, a personal computing system, a mobile computing device, mainframe computing system, workstation, image computer, parallel processor, or any other device known in the art. In general, the term "computing system" is broadly defined to encompass any device having one or more processors or other controllers, which execute instructions from a carrier medium.

Program instructions implementing functions, control operations, processing blocks, or steps, such as those manifested by embodiments described herein, may be transmitted over or stored on carrier medium. The carrier medium may be a transmission medium, such as, but not limited to, a wire, cable, or wireless transmission link. The carrier medium may also include a non-transitory signal bearing medium or storage medium such as, but not limited to, a read-only memory, a random access memory, a magnetic or optical disk, a solid-state or flash memory device, or a magnetic tape.

Furthermore, it is to be understood that the invention is defined by the appended claims. Although embodiments of this invention have been illustrated, it is apparent that various modifications may be made by those skilled in the art without departing from the scope and spirit of the disclosure.

What is claimed is:

1. A method for scanning a surface of a material with a shaped nozzle comprising:
   introducing a scan fluid to the surface of the material via a nozzle, the nozzle including
   a nozzle body configured to couple to a positionable nozzle arm support for positioning the nozzle with respect to a material surface, the nozzle body defining a fluid port configured to receive a fluid into the nozzle and defining an interior region having a vacuum port configured to couple with a vacuum source, and
   a nozzle hood coupled to the nozzle body, the nozzle hood including an exterior wall and an interior wall defining at a first fluid channel and a second fluid channel between the exterior wall and the interior wall and in fluid communication with the fluid port, the interior wall bounding at least a portion of the interior region, wherein an outlet of the fluid port is positioned between the exterior wall and the interior wall to introduce fluid from the fluid port into at least a portion of each of the first fluid channel and the second fluid channel to direct the fluid along the material surface within the portion of each of the first fluid channel and the second fluid channel during application of a vacuum to the vacuum port by the vacuum source;

directing the scan fluid along the surface of the material, via the nozzle, at least a portion of the fluid held within each of the first fluid channel and the second fluid channel;

joining the scan fluid from the first fluid channel and the second fluid channel together at a region of the nozzle hood distinct from the fluid port; and removing the scan fluid from the surface of the material through the nozzle.

2. The method of claim 1, wherein the interior wall includes an opening at the region of the nozzle hood opposite the fluid port, the opening providing fluid access into the interior region.

3. The method of claim 1, wherein at least one of the first fluid channel and the second fluid channel has a narrowed portion at the region of the nozzle hood opposite the fluid port.

4. The method of claim 1, wherein removing the scan fluid from the surface of the material through the nozzle includes removing the scan fluid from the surface of the material through the nozzle via at least one of the fluid port or a second fluid port disposed within the hood.

* * * * *